United States Patent [19]

Higgins et al.

[11] Patent Number: 4,566,184
[45] Date of Patent: Jan. 28, 1986

[54] PROCESS FOR MAKING A PROBE FOR HIGH SPEED INTEGRATED CIRCUITS

[75] Inventors: J. Aiden Higgins, Westlake Village; Emory R. Walton, Jr., Thousand Oaks, both of Calif.

[73] Assignee: Rockwell International Corporation, El Segundo, Calif.

[21] Appl. No.: 672,173

[22] Filed: Nov. 19, 1984

Related U.S. Application Data

[62] Division of Ser. No. 295,879, Aug. 24, 1981, abandoned.

[51] Int. Cl.⁴ .............................................. H05K 3/34
[52] U.S. Cl. ....................................... 29/840; 29/588; 264/272.15; 324/158 P
[58] Field of Search ................. 29/834, 588, 840, 841, 29/854, 855; 357/74; 264/272.15, 272.16, 272.17; 324/158 F, 158 P

[56] References Cited

U.S. PATENT DOCUMENTS 3,484,534 12/1969 Kilby et al. .
3,702,439 11/1972 McGahey et al. ............. 324/158 P
3,731,191 5/1973 Bullard et al. ................. 324/158 P
3,832,632 8/1974 Ardezzone ..................... 324/158 P
3,911,361 10/1975 Bove et al. ..................... 324/158 P
3,952,410 4/1976 Garretson et al. .

Primary Examiner—Howard N. Goldberg
Assistant Examiner—Carl J. Arbes
Attorney, Agent, or Firm—H. Fredrick Hamann; Craig O. Malin

[57] ABSTRACT

A miniaturized probe is provided for making contact with test probe pads on an integrated circuit. The probe tips are precisely positioned on the underside of a microwave substrate board. Short wires extend through a hole in the insulating board and connect the probe tips to a conductive line on the topside of the microwave substrate board. The wires are imbedded in a potting compound which also holds the probe tips. Precise location of the probe tips is accomplished during fabrication of the probe by using depressions etched in a substrate as a mold and depositing metal in these depressions using photoresist and deposition techniques.

2 Claims, 4 Drawing Figures

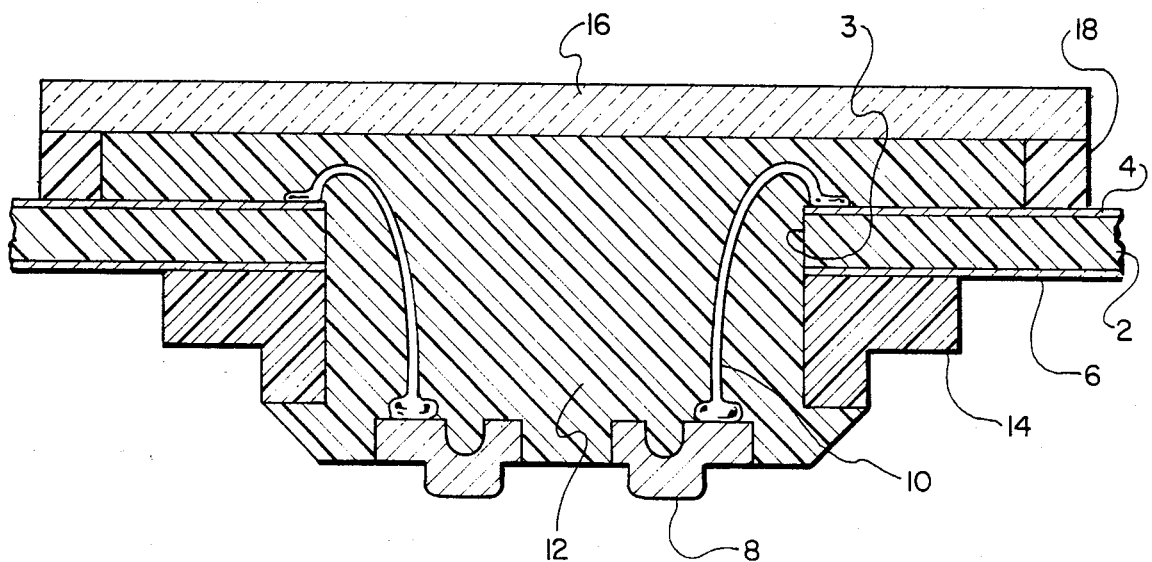
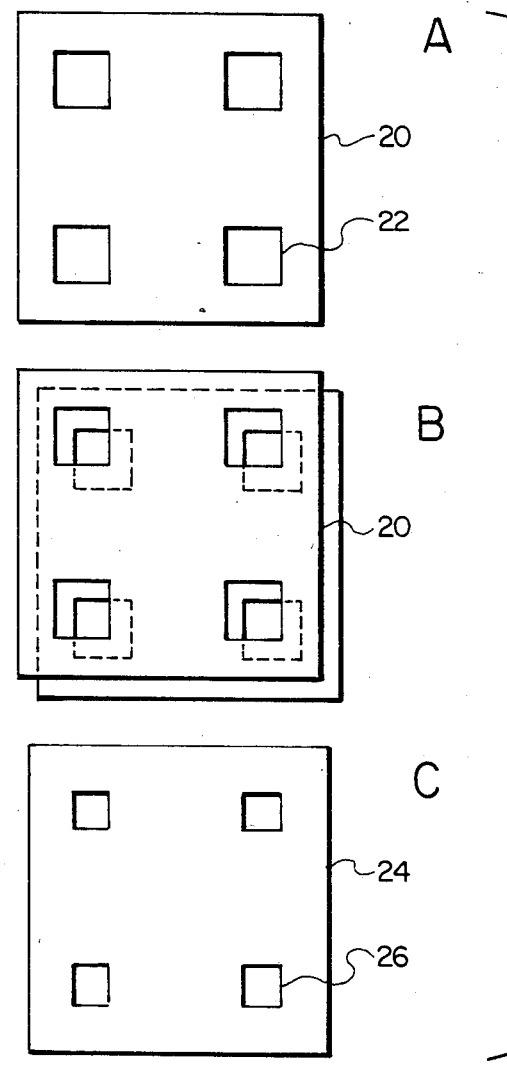
Fig.1.
Fig.2.

PROCESS FOR MAKING A PROBE FOR HIGH SPEED INTEGRATED CIRCUITS

STATEMENT OF GOVERNMENT INTEREST

This invention was made in the course of a contract with the Department of Defense.

This is a divisional of application Ser. No. 295,879, filed Aug. 24, 1981 now abandoned.

BACKGROUND OF THE INVENTION

This invention relates to the field of integrated circuits and particularly to probes used for testing high speed integrated circuits.

High speed integrated circuits have some very special needs which stem from the fact that they are generally more vulnerable to noise and that some of the sources of noise are enhanced under high speed conditions. One of these sources of noise is "ringing" which can originate in the probes used to test integrated circuits prior to packaging.

During the fabrication of integrated circuits, it is necessary to know which devices are worth packaging before going to the trouble and expense of doing so. Therefore, high speed testing must be done on the wafer. To perform high speed testing on a circuit while probing a wafer calls for a special probe set in order to prevent problems due to ringing.

The prime consideration in probing systems is that a mechanical system must be assembled which will simultaneously contact many pads in a very confined space which may be a millimeter on each side. The contact pads may be only 50 $\mu$m on a side. It is virtually impossible to bring controlled impedance lines into such an array, and the usual probe system consists of tungsten needle probes all converging into the area of the circuit.

Each needle probe is modeled as a high impedance line section 2 cm long with one side terminated in a 50 ohm termination and the other open circuit at the high impedance input of the digital integrated circuit. This is modeled by a simple equivalent circuit, taking the needle probe to be an air dielectric transmission line section having a characteristic impedance of 250 ohms. For a 500 M Bit signal, which is square, i.e. does have Fourier components up to 2 GHz, the simulation calculation shows that the resultant signal at the circuit end of the probe is considerably distorted. It looks more like a 1.5 GB signal to which a circuit with a 120 p sec switching rate would respond quite readily. Such effects can create a considerable error and shows the need for reliable test probes devoid of "ringing problems".

SUMMARY OF THE INVENTION

It is an object of the invention to provide an improved probe for testing high speed integrated circuits.

It is an object of the invention to provide a probe which has low noise from ringing when used to test high speed integrated circuits.

It is an object of the invention to provide a probe for high speed integrated circuits, which has low insertion loss.

It is an object of the invention to provide a probe for high speed integrated circuits, which has a minimum of undesirable coupling from one probe to another.

It is an object of the invention to provide a probe for high speed integrated circuits, which can be economically produced.

According to the invention, insertion loss, mismatch, undesireable coupling among probes, and noise caused by ringing is kept to a minimum by keeping the length of that portion of the probes which has uncontrolled impedance and which is unterminated at the tip very short, and by providing a ground plane close to the probes.

This is accomplished by using a very short wire to connect the probe tips to a microwave substrate board which has a ground plane on one side and has input, output, and D.C. conductive lines on the other side. The small probe tips are precisely positioned under the insulating board to contact the pads on the circuit being tested. Short wires extend through a hole in the board and connect the probe tips to the conductive lines on the topside of the board. The conductive lines have terminations and buffers where they are joined to the short wires in order to provide a good match to the circuit being probed. The wires are imbedded in an acrylic encapsulant or other potting compound which also holds the probe tips.

Precise location of the probe tips is accomplished during fabrication of the probe by using depressions etched in a substrate as a mold and depositing metal in these depressions. This can be accomplished using the same techniques used to fabricate integrated circuits. For example, GaAs or silicon or any suitable material can be used as a substrate and photoresist used to define the pad locations. Depressions, or pits, are created at the pad locations by etching, and these depressions are filled with probe tip metal by using integrated circuit fabrication procedures.

A thin ring-shaped spacer is placed on top of the substrate around the probe tips. The microwave substrate board is placed on top of the ring-shaped spacer with the spacer and the hole in the board being concentric. The probe tips and the conducting lines on the board are then connected by short wires. The cavity formed by the hole, spacer, and substrate is filled with a potting compound to protect the wires and to hold the probe tips in their precise location. The substrate is then removed by etching.

These and other objects and features of the invention will be apparent from the following detailed description taken with reference to the accompanying drawings.

BRIEF DESCRIPTION OF THE DRAWINGS

FIG. 1 is a partial cross section of a probe;

FIG. 2 is a top view of masks showing steps A-C for making a probe tip mask;

DESCRIPTION OF THE PREFERRED EMBODIMENT

Figure 4:
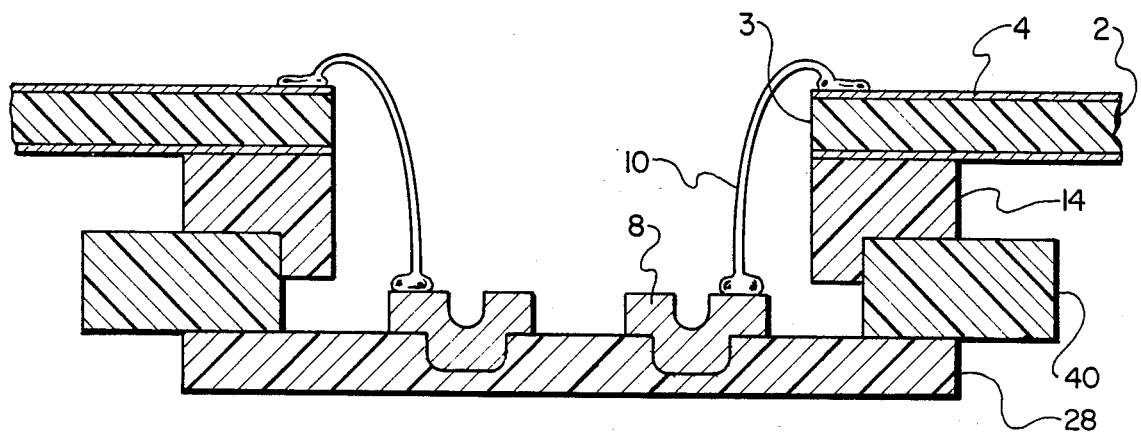
FIG. 4 is a partial cross section of a probe subassembly prior to potting the wires.

A partial cross section of the probe, according to the invention, is shown in FIG. 1. It consists of an alumina (aluminum oxide) board 2 which has a hole 3 through it. The top surface of board 2 has conductive deposits 4 which are the signal lines and DC lines of the microprobe circuit. The bottom surface of board 2 is coated with metal deposit 6 which serves as a ground for the microprobe circuit. The signal lines are terminated adjacent hole 3 with a known circuit to provide a good impedance match for the signal lines 4. Similarly, the DC lines are provided with buffer circuits for filtering out high frequency components.

Probe tips 8 are located below board 2 in the precise location required to contact the pads on the integrated circuit being tested. Although only two probe tips are shown in the FIG. 1 cross section, as many as thirty probe tips may be required to contact all the pads on some integrated circuits.

Probe tips 8 are connected to their respective signal lines or DC lines 4 by short lengths of wire 10. Typically wires 10 are 0.001 inch thick gold wires about 2 mm long. This short conductor is the only uncontrolled impedance line section in the probe, and it greatly reduces ringing and other problems associated with prior art probes which are much longer (typically about 2 cm long).

An encapsulant 12 holds probe tips 8 and wires 10 in place. Probes 8 extend about 0.002 inches or more out of encapsulant 12. There are numerous materials such as a clear acrylic potting compound which are suitable for this application.

A thin teflon ring 14 serves as a spacer and as a confining wall for encapsulant 12. The top of encapsulant 12 may be covered with a thin glass cover 16 which is spaced above wires 10 by ring 18.

Probes 8 can be fabricated and precisely located using photolithographic techniques similar to the techniques used to fabricate the integrated circuit which is being tested. FIG. 2 shows steps A-C which may be used to provide a mask for the process. In step 2A, mask 20 has a pattern 22 which matches the probe pads of the integrated circuit to be tested. Mask 20 is used to form a second mask 24 by photographically exposing its pattern twice, the second exposure being diagonally offset, as shown in step 2B. The result is mask 24 which has a pattern 26 of small probe pads that are in the same position as the larger probe pads on the integrated circuit to be tested. This is a convenient process for producing two useful masks starting with a single mask.

Figure 3:
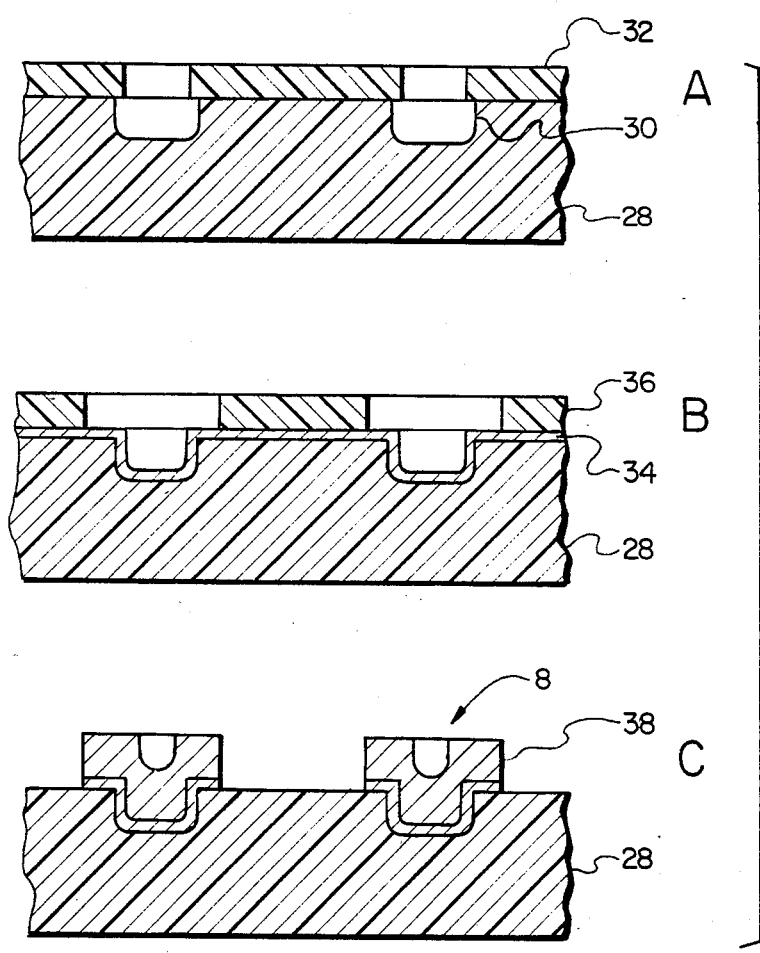
FIG. 3 is a cross section of a substrate showing steps A-C for making precisely located probe tips.

FIG. 3A shows a substrate 28 such as GaAs which has depressions 30 etched in its surface at openings in photoresist 32. These depressions are typically over 0.002 inches deep and are formed using mask 24 and using known photolithographic and etching techniques.

Photoresist 32 is then removed and a layer 34 of 1000 Å Au preceded by 200 Å Ti is deposited using a sputtering deposition method. A second photoresist pattern 36 is deposited over layer 34 using mask 20 with the larger probe pattern 22 as shown in FIG. 3B.

A thick layer of gold 38 is deposited over the first gold layer 34 in the openings in photoresist pattern 36. Thick layer 38 can be electrochemically deposited using layer 34 as a cathode. Photoresist 36 is then stripped off and the surface is lightly etched to remove the uncovered portions of thin metal layer 34, leaving the precisely located probe tips imbedded in GaAs substrate 28 as shown in FIG. 3C.

FIG. 4 is a subassembly showing how probe tips 8 are assembled to form the probe. A pair of circular teflon spacers 14 and 40 are placed on substrate 28 in alignment with hole 3 in board 2 and with probe tips 8 inside the spacers. These elements are held together with an adhesive to form a cavity. Gold wires 10 are bonded to probe tips 8 and to the tips of conductive lines 4 on the top surface of alumina board 2. The cavity and the area around wires 8 are filled with an acrylic potting compound. This compound protects the wires and holds the probe tips in place, permitting removal of substrate 8 by the use of an appropriate etchant.

Thus, a probe is provided which has precisely positioned probe tips that are connected to a properly matched and buffered circuit on an alumina board. Because of the short length of the connecting wires, the ringing period is small enough to avoid any erroneous switching in very high speed circuits. Additionally, the insertion loss and undesireable coupling from one probe to another are reduced because of the shortness of the probes and the near proximity of a ground plane on the bottom face of the alumina board.

Numerous variations and modifications can be made without departing from the invention. For example, connecting wires 10 can be connected to lines deposited on the bottom surface of alumina board 12 rather than on the top surface. Different means for spacing the board from the probe tips can be used. Other substrate materials and other means for depositing the probe metal in the depressions in the substrate can be used. Accordingly, it should be clearly understood that the form of the invention described above and shown in the accompanying drawings is illustrative only and is not intended to limit the scope of the invention.

What is claimed is:

1. A process of making a probe for integrated circuits, comprising:
    selectively etching a substrate to form a mold having a depression at a predetermined probe tip location;
    depositing metal in said depression to form a probe tip;
    placing a spacer on said substrate around said probe tip;
    placing a board of insulating material on top of said spacer, said board having a conductive deposit on its surface and having a hole adjacent said probe tip which extends through said board;
    bonding one end of a wire to said probe tip and the other end to said conductive deposit;
    encapsulating said wires; and
    removing said substrate.

2. The process as claimed in claim 1, wherein said selective etching step comprises:
    providing a first mask having a pattern which defines a probe pad that matches a probe pad of the integrated circuit to be tested;
    forming a second mask for photographically exposing a mask negative to said first mask pattern and then moving said first mask so as to overlap only a portion of said pattern and photographically exposing said mask negative a second time, whereby said second mask defines only a portion of said integrated circuit probe;
    coating said substrate with a photoresist;
    exposing said photoresist to radiation which has passed through said second mask;
    developing said exposed photoresist to form a resist pattern on the surface of said substrate;
    exposing said resist pattern to an etchant, whereby said substrate is selectively etched.

* * * * *